United States Patent
Park et al.

(10) Patent No.: US 8,097,913 B2
(45) Date of Patent: Jan. 17, 2012

(54) ELECTRICALLY ERASABLE AND PROGRAMMABLE READ ONLY MEMORY DEVICE COMPRISING COMMON SOURCE REGION AND METHOD OF MANUFACTURING SAME

(75) Inventors: Weon-Ho Park, Suwon-si (KR); Jeong-Uk Han, Suwon-si (KR); Yong-Tae Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 756 days.

(21) Appl. No.: 11/891,605

(22) Filed: Aug. 10, 2007

(65) Prior Publication Data

US 2008/0054345 A1    Mar. 6, 2008

(30) Foreign Application Priority Data

Sep. 5, 2006   (KR) ................. 10-2006-0085025

(51) Int. Cl.
*H01L 27/115*   (2006.01)
*H01L 21/8247*   (2006.01)

(52) U.S. Cl. .......... 257/321; 257/E27.103; 257/E21.68; 257/E21.683; 438/264

(58) Field of Classification Search ............. 257/315, 257/316, 321, 324, E27.102, E27.103, 314, 257/319, 322, E21.645, E21.662 E21.666, 257/E21.667, E21.68, E21.681, E21.682, 257/E21.683, E21.684, E21.685, E21.686, 257/E21.687, E21.688, E21.689, E21.69, 257/E21.691, E21.692, E21.693, E21.694; 438/257, 258, 264, 268

See application file for complete search history.

(56) References Cited

U.S. PATENT DOCUMENTS

| | | | |
|---|---|---|---|
| 6,169,307 B1 | 1/2001 | Takahashi et al. | |
| 6,291,853 B1 | 9/2001 | Io | |
| 6,316,317 B1 | 11/2001 | Kawata et al. | |
| 6,654,283 B1 * | 11/2003 | Haddad | 365/185.17 |
| 2006/0079045 A1 | 4/2006 | Kim et al. | |

FOREIGN PATENT DOCUMENTS

| | | |
|---|---|---|
| JP | 11-177068 | 7/1999 |
| JP | 2000068484 | 3/2000 |
| JP | 2000269361 | 9/2000 |
| JP | 2004310842 | 11/2004 |
| KR | 1019990033310 | 6/2002 |
| KR | 1020060032868 | 4/2006 |

* cited by examiner

*Primary Examiner* — Samuel A Gebremariam
*Assistant Examiner* — Andrew O. Arena
(74) *Attorney, Agent, or Firm* — Onello & Mello, LLP

(57) ABSTRACT

An electrically erasable and programmable read only memory (EEPROM) device and a method of manufacturing the EEPROM device are provided. First and second gate structures having the same structure are formed on a tunnel insulating layer formed on a substrate, such that the first and second gate structures are spaced apart from each other. A common source region is formed at a portion of the substrate located between the first and second gate structures. First and second drain regions are formed at first and second portions of the substrate adjacent to the first and second gate structures, respectively. Thus, the EEPROM device is manufactured including first and second transistors that have the same structure and may alternately serve as a memory transistor and a selection transistor according to an applied signal.

23 Claims, 12 Drawing Sheets

ELECTRICALLY ERASABLE AND PROGRAMMABLE READ ONLY MEMORY DEVICE COMPRISING COMMON SOURCE REGION AND METHOD OF MANUFACTURING SAME

CROSS-REFERENCE TO RELATED APPLICATION

This application claims priority under 35 USC §119 to Korean Patent Application No. 10-2006-0085025 filed on Sep. 5, 2006, the contents of which are herein incorporated by reference in its entirety.

BACKGROUND OF THE INVENTION

1. Field of the Invention

The present invention relates to an electrically erasable and programmable read only memory (EEPROM) device and a method of manufacturing an EEPROM device. More particularly, the present invention relates to an EEPROM device having a relatively simple structure capable of achieving a relatively large integration degree and a reliability and a method of manufacturing the EEPROM device capable of reducing cost and time required to manufacture the EEPROM.

2. Description of the Related Art

Generally, a semiconductor memory device may be classified as a volatile semiconductor memory device or a non-volatile semiconductor memory device. The volatile semiconductor memory device may be a dynamic random access memory (DRAM) device or a static random access memory (SRAM) device. The volatile semiconductor memory device might not retain its data when a time elapses. However, it may take less time to input or output data in the volatile memory device. The non-volatile semiconductor memory device may retain its data even when a time elapses. However, it may take greater time to input or output data in the non-volatile memory device. Recently, the non-volatile semiconductor memory device such as an electrically erasable and programmable read only memory (EEPROM) device and a flash memory device is much in demand.

A memory cell of a conventional EEPROM device may include a memory transistor and a selection transistor. For example, a conventional EEPROM device is disclosed in Korean Patent No. 341657 and Korean Patent Laid-Open Publication No. 2006-32868.

FIGS. 1 to 7 are cross-sectional views illustrating a method of manufacturing the conventional EEPROM device disclosed in Korean Patent Laid-Open Publication No. 2006-32868.

Referring to FIG. 1, an isolation layer (not shown) is formed at a surface of a substrate 3 so that the substrate 3 may be divided into a memory transistor region I and a selection transistor region II.

Tunnel impurity regions 6 are formed at a surface portion of the substrate 3 located between the memory transistor region I and the selection transistor region II. Thereafter, a first mold layer 9, a second mold layer 12, and a third mold layer 15 may be subsequently formed on the substrate 3, where the tunnel impurity regions 6 are formed. The first, second, and third mold layers 9, 12 and 15 may be formed using a silicon oxide, a silicon nitride, and a silicon oxynitride, respectively.

Referring to FIG. 2, a first mold layer pattern 18, a second mold layer pattern 21, and a third mold layer pattern 24 are subsequently formed on the substrate 3 by patterning the first, second, and third mold layers 9, 12 and 15.

The memory transistor region I may be exposed when the first, second, and third mold layer patterns 18, 21 and 24 are formed. This is because the first, second, and third mold layer patterns 18, 21 and 24 are formed on the selection transistor region II.

A tunnel insulating layer 27 is formed on the substrate 3 to cover the third mold layer pattern 24. The tunnel insulating layer 27 may be formed using the silicon oxide to cover the selection transistor region II that is not covered with the first, second and third mold layer patterns 18, 21 and 24.

Referring to FIG. 3, a nitride layer is formed on the tunnel insulating layer 27. Thereafter, the nitride layer and the tunnel insulating layer 27 are partially etched until the memory transistor region I and third mold layer pattern 24 are exposed so that a tunnel insulating layer pattern 30 and a spacer 33 may be formed on sidewalls of the first, second, and third mold layer patterns 18, 21 and 24.

A gate insulating layer 36 is formed on the memory transistor region I that is not covered with the tunnel insulating layer pattern 30 and the spacer 33. The gate insulating layer 36 may include silicon oxide. The gate insulating layer 36 may have a thickness larger than that of the tunnel insulating layer pattern 30.

Referring to FIG. 4, the spacer 33 is removed from the tunnel insulating layer pattern 30. A first conductive layer is then formed on the gate insulating layer 36, the tunnel insulating layer pattern 30, and the third mold layer pattern 24. The first conductive layer may include polysilicon doped with impurities.

The first conductive layer is partially removed until the third mold layer pattern 24 is exposed so that a first conductive pattern 39 is formed on the gate insulating layer 36. The third mold layer pattern 24 is then removed from the second mold layer pattern 21. The first conductive pattern 39 may serve as a floating gate of the memory transistor.

Referring to FIG. 5, the second mold layer pattern 21 located on the first mold layer pattern 18 is removed so that the tunnel insulating layer pattern 30 formed on the sidewalls of the first conductive layer pattern 39 and the first mold layer pattern 18 may be exposed.

A sidewall spacer 42 is formed on the sidewalls of the exposed first mold layer pattern 18 and the exposed tunnel insulating layer pattern 30. The first mold layer pattern 18 located on the selection transistor region II is then removed. Accordingly, the selection transistor region II may be exposed again by removing the first mold layer pattern 18.

A gate insulating interlayer 45 is formed on a resultant area formed between the exposed selection transistor region II and the memory transistor region I. For example, the gate insulating interlayer 45 may be formed to cover the sidewall spacer 42, the tunnel insulating layer pattern 30, and the first conductive pattern 39 within the memory transitory region I.

Referring to FIG. 6, a second conductive layer 48 is formed on the gate insulating interlayer 45. The second conductive layer 48 may be formed using polysilicon or metal silicide.

The second conductive layer 48 is partially etched by a photolithography process so that a hole 51 exposing a portion of the memory transistor region I is formed. A source region 54 is formed at the exposed memory transistor region I by an ion implantation process. The source region 54 located between the tunnel impurity regions 6 may be formed within the memory transistor region I located between the tunnel impurity regions 6.

Referring to FIG. 7, a control gate 57 of a memory transistor 72 and a selection gate 60 of a selection transistor 75 are formed by patterning the second conductive layer 48. The gate insulating interlayer 45 is then patterned so that gate insulating interlayer patterns 63 may be formed. The gate insulating interlayer patterns 63 are formed between the first conductive pattern 39 serving as a floating gate and the control gate 57 within the memory transistor region I. In addition, the gate insulating interlayer patterns 63 are formed between the substrate 3 and the selection gate 60 within the selection transistor region II.

An insulating layer may be formed on the substrate 3 to cover the memory transistor 72 and the selection transistor 75. Gate spacers 66 may be then formed on sidewalls of the memory transistor 72 and the selection transistor 75 by anisotropically etching the insulating layer.

A drain region 69 located between the selection gates 75 is formed within the selection transistor region II by an ion implantation process employing the selection transistor 75 and the gate spacer 66 as ion implantation masks. Accordingly, the EEPROM device may be manufactured on the substrate 3.

However, the above EEPROM device includes the memory transistor and the selection transistor having different structures so that the number of processes required for manufacturing the EEPROM device is relatively large. Thus, cost and time required for manufacturing the EEPROM device may increase. In addition, a yield of the EEPROM device may decrease. Recently, a size of a unit memory cell included in the EEPROM becomes smaller to achieve a relatively large capacity. However, it is difficult to reduce the size of the unit memory cell included in the EEPROM device because the memory cell of the EEPROM device includes the transistors having different structures. In addition, a reliability of the EEPROM device may be inferior because relatively complex processes are required to manufacture the EEPROM device.

SUMMARY OF THE INVENTION

In accordance with the present invention, provided is an EEPROM device having a relatively simple structure, a relatively high integration degree, and an improved reliability Also in accordance with the present invention, provided is a method of manufacturing the EEPROM device capable of reducing cost and time required for manufacturing the EEPROM and improving a yield of the EEPROM.

In accordance with one aspect of the present invention, an electrically erasable and programmable read only memory (EEPROM) device includes a substrate and a pair of transistors. The pair of transistors includes first and second transistors formed on the substrate. The first and second transistors have substantially the same structure. The first transistor and the second transistor are configured to alternately serve as a memory transistor and a selection transistor according to an applied signal.

The first transistor may include a tunnel insulating layer, a first gate structure, a first drain region, and a common source region. The tunnel insulating layer may be formed on the substrate. The first gate structure may be formed on the tunnel insulating layer. The first drain region may be formed at a first portion of the substrate adjacent to the first gate structure. The common source region may be formed at a portion of the substrate located between the first transistor and the second transistor. The second transistor may include the tunnel insulating layer, a second gate structure, a second drain region, and the common source region. The tunnel insulating layer may be formed on the substrate. The second gate structure may be formed on the tunnel insulating layer. The second drain region may be formed at a second portion of the substrate adjacent to the second gate structure.

The EEPROM device may further include a bit line electrically connected to the first drain region and the second drain region.

The common source region, the first drain region, and the second drain region may have a first impurity concentration, a second impurity concentration, and a third impurity concentration, respectively. The second and third impurity concentrations may be substantially larger than the first impurity concentration.

The substrate may have a first conductive type. The common source region, the first drain region, and the second drain region may have a second conductive type.

The first conductive type may be a P-type and the second conductive may be an N-type.

The first gate structure may include a first floating gate formed on the tunnel insulating layer, a gate insulating structure formed on the first floating gate, and a first control gate formed on the first gate insulating structure. The second gate structure may include a second floating gate formed on the tunnel insulating layer, a second gate insulating structure formed on the second floating gate, and a second control gate formed on the second gate insulating structure.

The first gate insulating structure may include a first lower oxide layer pattern, a first nitride layer pattern, and a first upper oxide layer pattern. The second gate insulating structure may include a second lower oxide layer pattern, a second nitride layer pattern, and a second upper oxide layer pattern.

The first lower oxide layer pattern, the second lower oxide layer pattern, the first upper oxide layer pattern, and the second upper oxide layer pattern may comprise a middle temperature oxide and the first nitride layer pattern and the second nitride layer pattern may comprises a silicon oxide.

The tunnel insulating layer may include a center portion, a first portion, and a second portion. The center portion may be located on the common source region such that the center portion is upwardly protruded with respect to the substrate. The first and second portions may be formed at both sides of the center portion.

In the above case, a first portion of the first gate structure may be located on the first portion of the tunnel insulating layer. A second portion of the first gate structure opposite to the first portion of the first gate structure may be located on the center portion of the tunnel insulating layer. In addition, a first portion of the second gate structure may be located on the second portion of the tunnel insulating layer. A second portion of the second gate structure opposite to the first portion of the second gate structure may be located on the center portion of the tunnel insulating layer.

The EEPROM device may further include gate spacers formed on sidewalls of the first transistor and the second transistor.

In accordance with another aspect of the present invention, there is provided a method of manufacturing an EEPROM device. In the method, a tunnel insulating layer is formed on a substrate. First and second gate structures are formed on the tunnel insulating layer. The first and second gate structures are spaced apart from each other. The first and second gate structures have substantially the same structure. A common source region is formed at a portion of the substrate located between the first and second gate structures. A first drain region is formed at a first portion of the substrate adjacent to the first gate structure. A second drain region is formed at a second portion of the substrate adjacent to the second gate structure.

Forming the tunnel insulating layer may include forming a preliminary tunnel insulating layer on the substrate. The preliminary tunnel insulating layer may be partially etched so that the tunnel insulating layer may be formed on the common source region. The tunnel insulating layer may have a center portion upwardly protruded with respect to the substrate.

Forming the first and second gate structures may include forming a first floating gate and a second floating gate spaced apart from each other on the tunnel insulating layer. A first gate insulating structure and a second gate insulating structure are formed on the first floating gate and the second floating gate, respectively. A first control gate and a second control gate are formed on the first gate insulating structure and the second gate insulating structure, respectively.

Forming the first and second floating gates may include forming a first conductive layer on the tunnel insulating layer. First mask patterns are formed on the first conductive layer. The first conductive layer is etched using the first mask patterns as etch masks.

In the above case, spacers may be formed on sidewalls of the first mask patterns.

Forming the first and second gate insulating structures may include forming a lower oxide layer is formed on the first floating gate, the second floating gate, and the substrate. A nitride layer is formed on the lower oxide layer. An upper oxide layer is formed on the nitride layer. The upper oxide layer, the nitride layer, and the lower oxide layer are patterned to form the first and second gate insulating structures on the first floating gate and the second floating gate, respectively. The first gate insulating structure may include a first lower oxide layer pattern, a first nitride layer pattern, and a first upper oxide layer pattern. The second gate insulating structure may include a second lower oxide layer pattern, a second nitride layer pattern, and a second upper oxide layer pattern.

Forming the first and second control gates may include forming a second conductive layer on the tunnel insulating layer, the first gate insulating structure, and the second gate insulating structure. Second mask patterns are formed on the second conductive layer. The second conductive layer is etched by using the second mask patterns as etch masks.

Gate spacers may be formed on the sidewalls of the first and second gate structures.

In the above case, the first and second drain regions may be formed after the gate spacers are formed.

A first protecting layer and a second protecting layer may be formed on the sidewalls and an upper surface of each of the first and second gate structures before the common source region is formed.

The first and second protecting layers may be formed by an oxidation process.

In the above case, the first and second protecting layers may be removed after the common source region is formed.

According to aspects of the present invention, the EEPROM device includes the first and second transistors having substantially the same structure. The first transistor and the second transistor alternately serve as the memory transistor and the selection transistor of the EEPROM device in response to the applied signal. Accordingly, the EEPROM device having a relatively simple structure may be manufactured by the reduced number of processes. As a result, a time and a cost required for manufacturing the EEPROM device may be decreased. In addition, an area where a unit memory cell of the EEPROM device is formed may be decreased because the unit memory cell of the EEPROM includes the pair of transistors having substantially the same structure.

BRIEF DESCRIPTION OF THE DRAWINGS

The present invention will become apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention, wherein.

DESCRIPTION OF THE EMBODIMENTS

Figure 1:
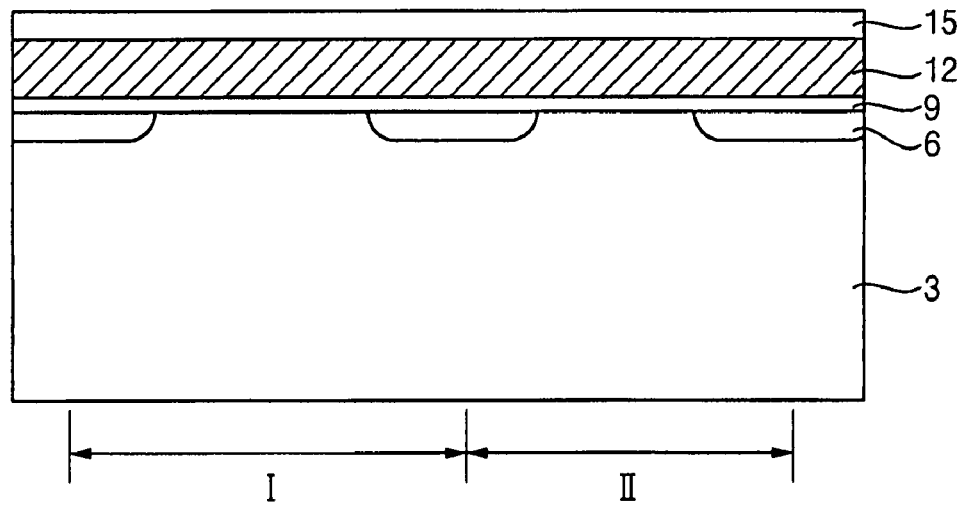
FIGS. 1 to 7 are cross-sectional views illustrating a method of manufacturing a conventional electrically erasable and programmable read only memory (EEPROM) device disclosed in Korean Patent Laid-Open Publication No. 2006-32868.
Figure 2:
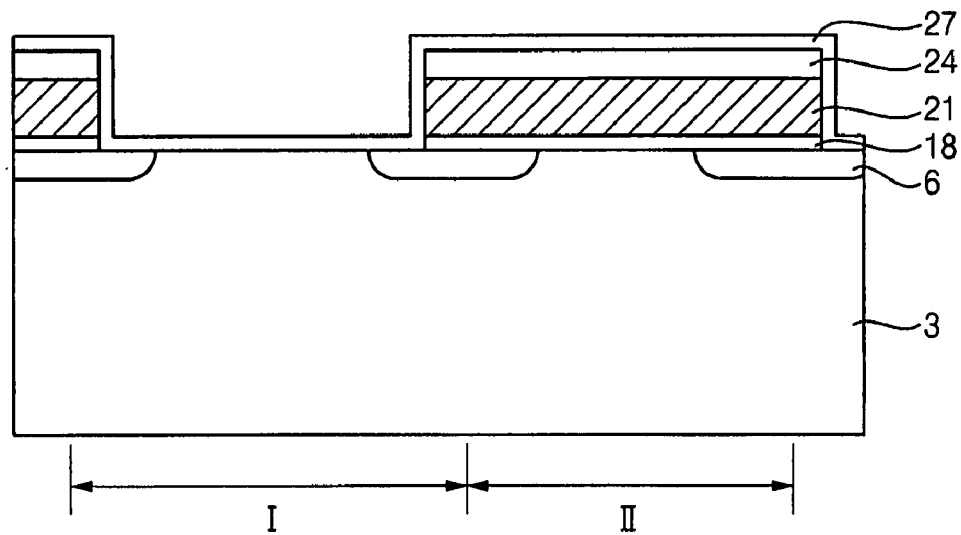
Figure 3:
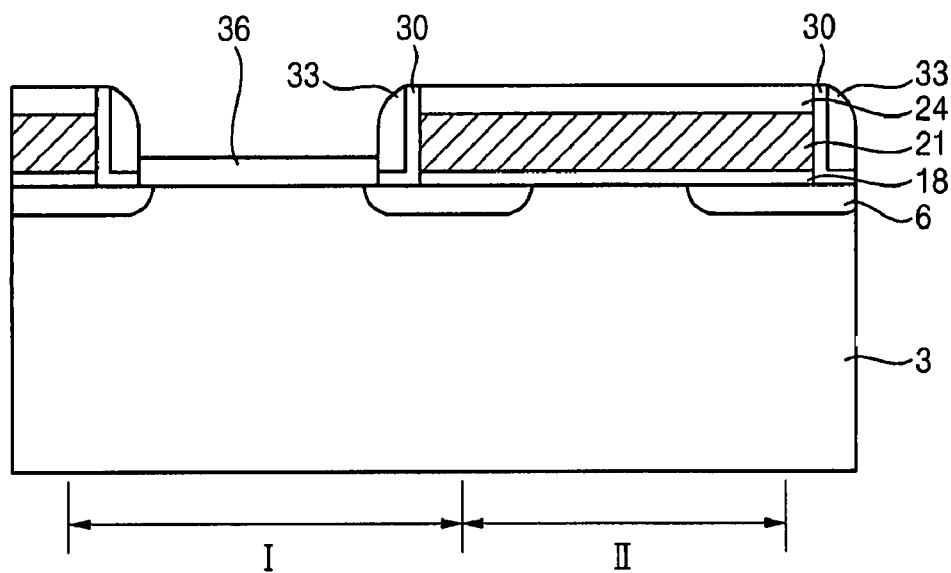
Figure 4:
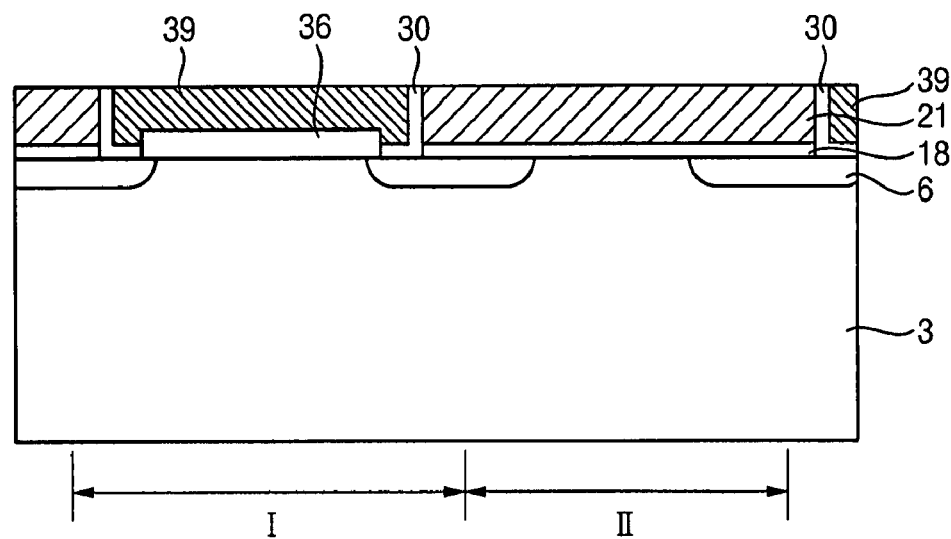
Figure 5:
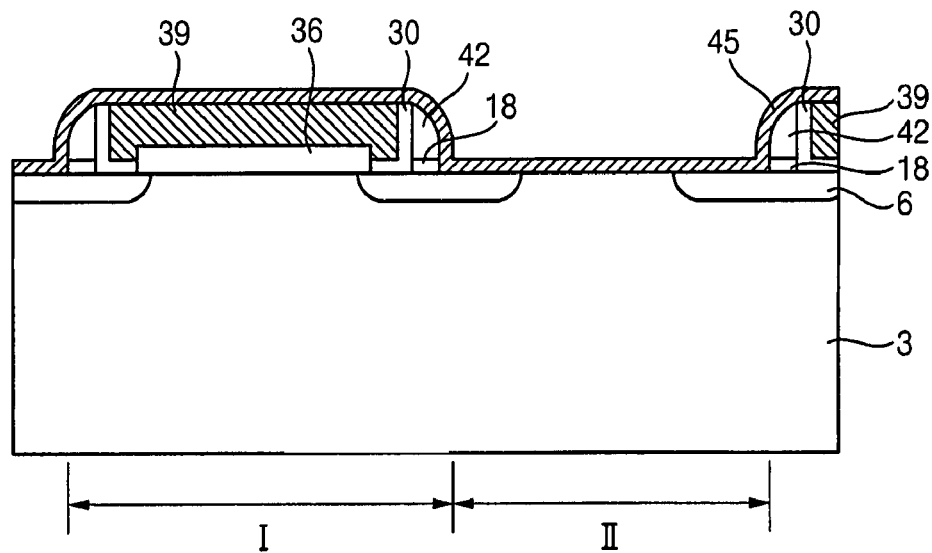
Figure 6:
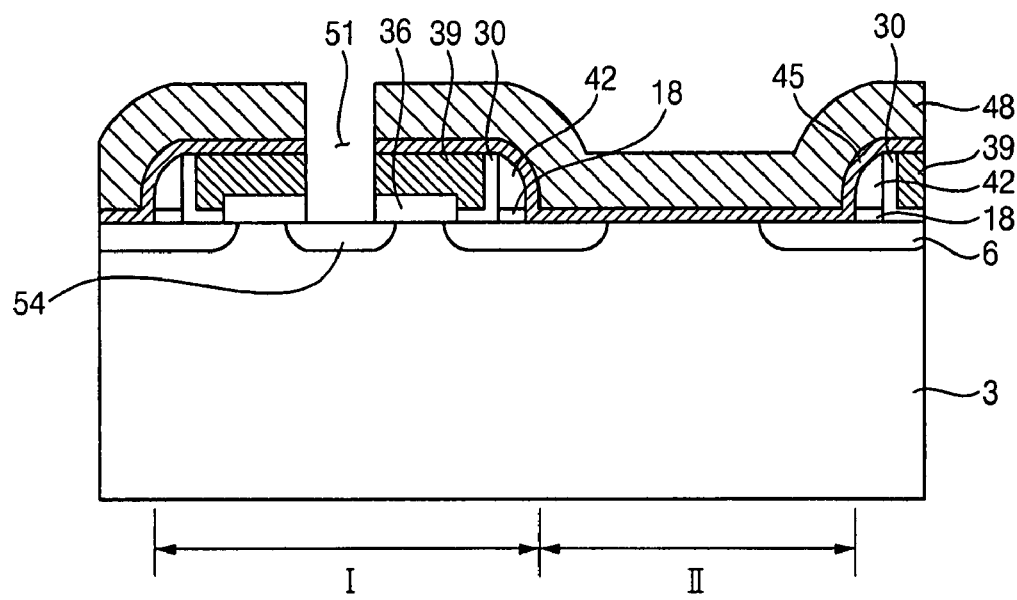
Figure 7:
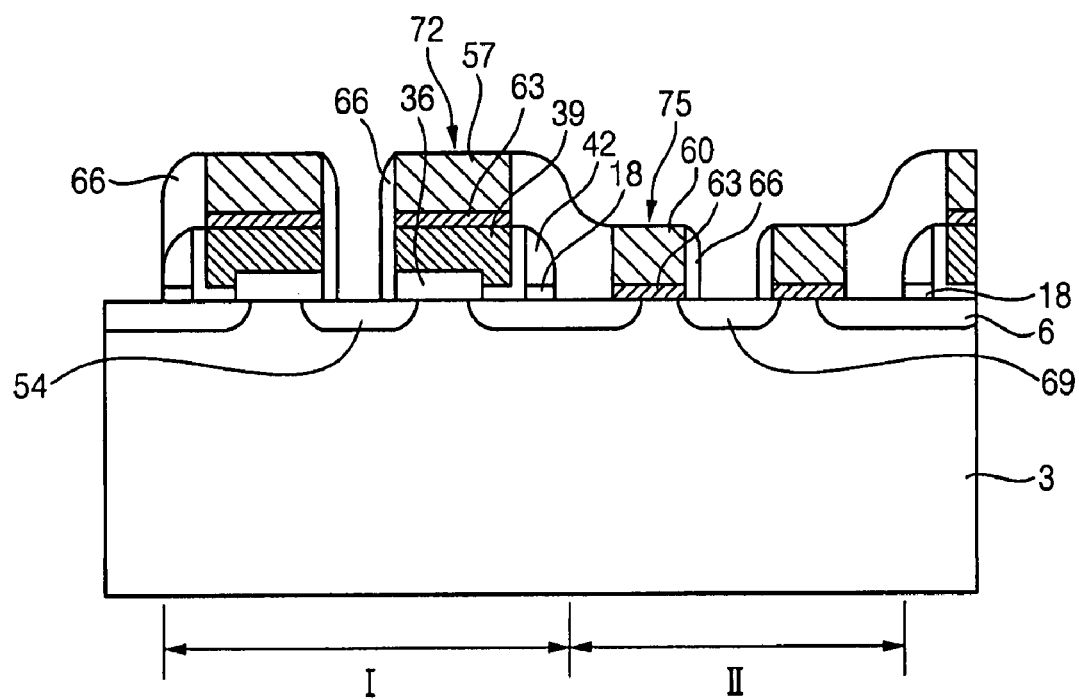

Hereinafter, aspects of the present invention will be described by explaining illustrative embodiments in accordance therewith, with reference to the attached drawings. The present invention may, however, be embodied in many different forms and should not be construed as limited to the example embodiments set forth herein. In the drawings, the sizes and relative sizes of layers and regions might be exaggerated for clarity.

It will be understood that when an element or layer is referred to as being "on" or "connected to" another element or layer, it may be directly on, connected or coupled to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) in accordance with aspects of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Figure 8:
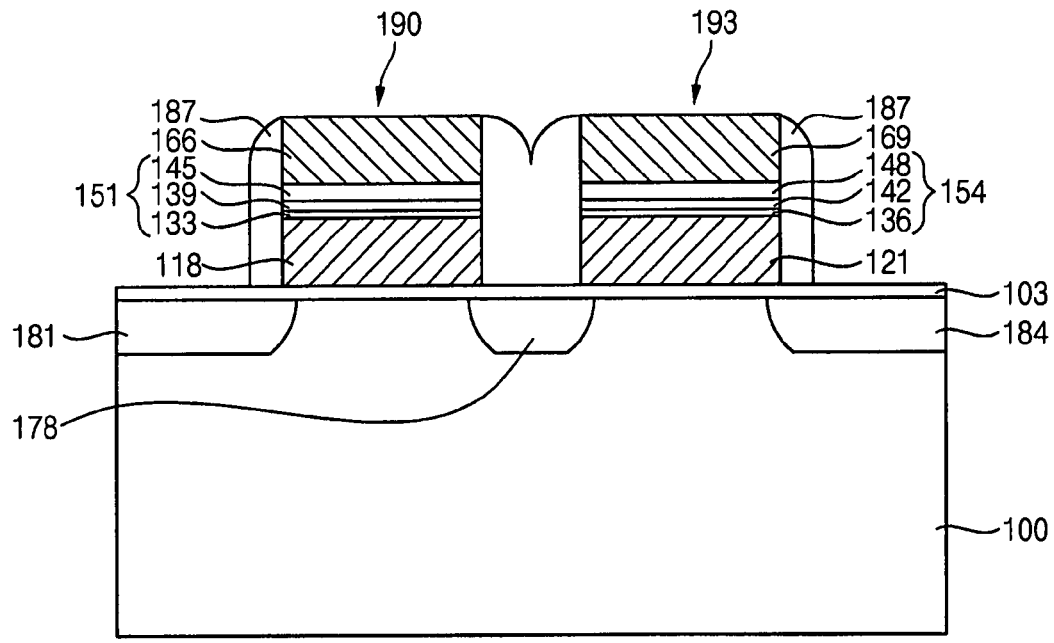
FIG. 8 is a cross-sectional view illustrating an example embodiment of an EEPROM device in accordance with an aspect of the present invention.

FIG. 8 is a cross-sectional view illustrating an example embodiment of an electrically erasable and programmable read only memory (EEPROM) device in accordance with an aspect of the present invention.

Referring to FIG. 8, the EEPROM device may include first and second transistors 190 and 193. The first and second transistors 190 and 193 may be formed on a substrate 100 such that the first and second transistors 190 and 193 may be spaced apart from each other. The substrate 100 may be a semiconductor substrate such as a silicon wafer or a silicon-on-insulator (SOI) substrate, as examples. In an example embodiment, the substrate 100 may be a first conductive type. For example, the substrate 100 may be a P-typed semiconductor substrate.

The first transistor 190 may include a tunnel insulating layer 103, a first floating gate 118, a first gate insulating structure 151 and a first control gate 166. The tunnel insulating layer 103 may be formed on the substrate 100. The first gate insulating structure 151 may include a first lower oxide layer pattern 133, a first nitride layer pattern 139 and a first upper oxide layer pattern 145 that are successively formed on the first floating gate 118.

The tunnel insulating layer 103 may include an oxide, e.g., such as silicon oxide. The tunnel insulating layer 103 may be formed to a relatively thin thickness of about 50 Å to about 100 Å measured from an upper surface of the substrate 100. For example, the tunnel insulating layer 103 may have a thickness of about 70 Å. In another example embodiment, the tunnel insulating layer 103 may include a metal oxide such as aluminum oxide, zirconium oxide, titanium oxide, tantalum oxide, etc.

The first floating gate 118 may include a polysilicon doped with impurities. The first floating gate 118 may be formed to a thickness of about 1000 Å to about 2000 Å measured from an upper surface of the tunnel insulating layer 103. For example, the first floating gate 118 may have a thickness of about 1500 Å. In another example embodiment, the first floating gate 118 may include a metal or a metal nitride.

The first lower oxide layer pattern 133 included in the first gate insulating structure 151 may include an oxide such as middle temperature oxide (MTO). The first lower oxide layer pattern 133 included in the first gate insulating structure 151 may be formed to a thickness of about 10 Å to about 50 Å measured from an upper surface of the first floating gate 118. For example, the first lower oxide layer pattern 133 may have a thickness of about 30 Å. The first nitride layer pattern 139 may include a nitride, e.g., such as silicon nitride. The first nitride layer pattern 139 may be formed to a thickness of about 50 Å to about 90 Å measured from an upper surface of the first lower oxide layer pattern 133. For example, the first nitride layer pattern 139 may have a thickness of about 70 Å. The first upper oxide layer pattern 145 formed on the first nitride layer pattern 139 may include MTO. The first upper oxide layer pattern 145 may be formed to a thickness of about 50 Å to about 150 Å measured from an upper surface of the first nitride layer patter 139. Accordingly, a thickness ratio among the first lower oxide layer pattern 133, the first nitride layer pattern 139, and the first upper oxide layer pattern 145 may be from about 1:5:5 to 5:9:15 (or 1-5:5-9:5-15).

The first control gate 166 may include polysilicon doped with the impurities. The first control gate 166 may be formed to a thickness of about 1000 Å to about 2000 Å measured from an upper surface of the first upper oxide layer pattern 145. For example, the first control gate 166 may have a thickness of about 1500 Å.

The second transistor 193 may be substantially the same as the first transistor 190 structurally. The second transistor 193 may include a tunnel insulating layer 103, a second floating gate 121, a second gate insulating structure 154 and a second control gate 169. The second floating gate 121 and the second control gate 169 may be substantially structurally the same as the first floating gate 118 and the first control gate 166, respectively. In addition, the second gate insulating structure 154 may include the second lower oxide layer pattern 136, the second nitride layer pattern 142, and the second upper oxide layer pattern 148 that are successively formed on the second floating gate 121 so that the second gate insulating structure 154 may be substantially structurally the same as the first gate insulating structure 151.

The second floating gate 121 may include metal, metal nitride or polysilicon that is doped with impurities, as examples. The second floating gate 121 may have substantially the same thickness as the first floating gate 118. For example, the second floating gate 121 may be formed to a thickness of about 1000 Å to about 2000 Å measured from an upper surface of the tunnel insulating layer 103.

The second lower oxide layer pattern 136 included in the second gate insulating structure 154 may include MTO. The second lower oxide layer pattern 136 included in the second gate insulating structure 154 may be formed to a thickness of about 10 Å to about 50 Å measured from an upper surface of the second floating gate 121. For example, the second nitride layer pattern 142 may include a nitride, such as silicon nitride. The second nitride layer pattern 142 may be formed to a thickness of about 50 Å to about 90 Å measured from an upper surface of the second lower oxide layer pattern 136. In addition, the second upper oxide layer pattern 148 may include an oxide such as MTO. The second upper oxide layer pattern 148 may be formed to a thickness of about 50 Å to about 150 Å measured from an upper surface of the second nitride layer pattern 142. A thickness ratio among the second lower oxide layer pattern 136, the second nitride layer pattern 142 and the second upper oxide layer pattern 154 may be about 1:5:5 to 5:9:15 (or 1-5:5-9:5-15).

The second control gate 169 may include metal, metal nitride or polysilicon that is doped with the impurities. The second control gate 169 may be formed to a thickness of about 1000 Å to about 2000 Å measured from an upper surface of the second upper oxide layer pattern 148.

Gate spacers 187 may be formed on sidewalls of the first and second transistors 190 and 193. A common source region 178 may be formed at a portion of the substrate 100 located between the first and second transistors 190 and 193. In addition, a first drain region 181 may be formed at a first portion of the substrate 100 adjacent to the first transistor 190. A second drain region 184 may be formed at a second portion of the substrate 100 adjacent to the second transistor 193. The first and second drain regions 181 and 184 may correspond to first and second bit line junction regions with which bit lines make electric contact. In another example embodiment, the gate spacers 187 need not be formed on the sidewalls of the first and second transistors 190 and 193.

The common source region 178 of the first and second transistors 190 and 193 may have a relatively low first impurity concentration of about $1 \times 10^{14}$ to about $9 \times 10^{14}$ atoms/$cm^2$, for example. The common source region 178 may be a second conductive type substantially different from the first conductive type of the substrate 100. For example, the common source region 178 may include N-typed impurities, e.g., such as phosphorus (P).

The first drain region 181 adjacent the first transistor 190 may have a relatively large second impurity concentration of about $1 \times 10^{15}$ to about $9 \times 10^{15}$ atoms/$cm^2$, for example. For example, the first drain region 181 may be the second conductive type substantially different from the first conductive type of the substrate 100. For example, the first drain region 181 may include N-typed impurities, e.g., such as arsenic (As).

The second drain region 184 adjacent to the second transistor 193 may have a third impurity concentration of about $1 \times 10^{15}$ to about $9 \times 10^{15}$ atoms/$cm^2$, for example. For example, the second impurity concentration of the first drain region 181 may be substantially the same as the third impurity concentration of the second drain region 184. In addition, the second drain region 184 may be the second conductive type substantially different from the first conductive type of the substrate 100. For example, the second drain region 184 may include the N-typed impurities, e.g., such as arsenic (As).

Hereinafter, programming and erasing operations of the EEPROM device in FIG. 8 will be described.

Figure 9:
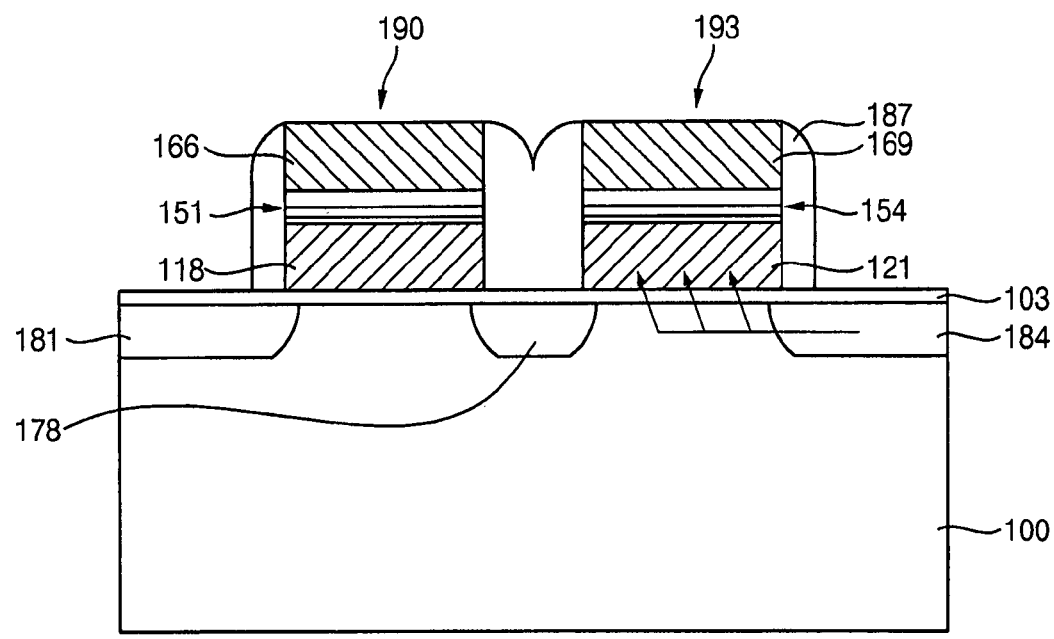
FIGS. 9 and 10 are cross-sectional views illustrating the programming and erasing operations of the EEPROM device in FIG. 8.
Figure 10:
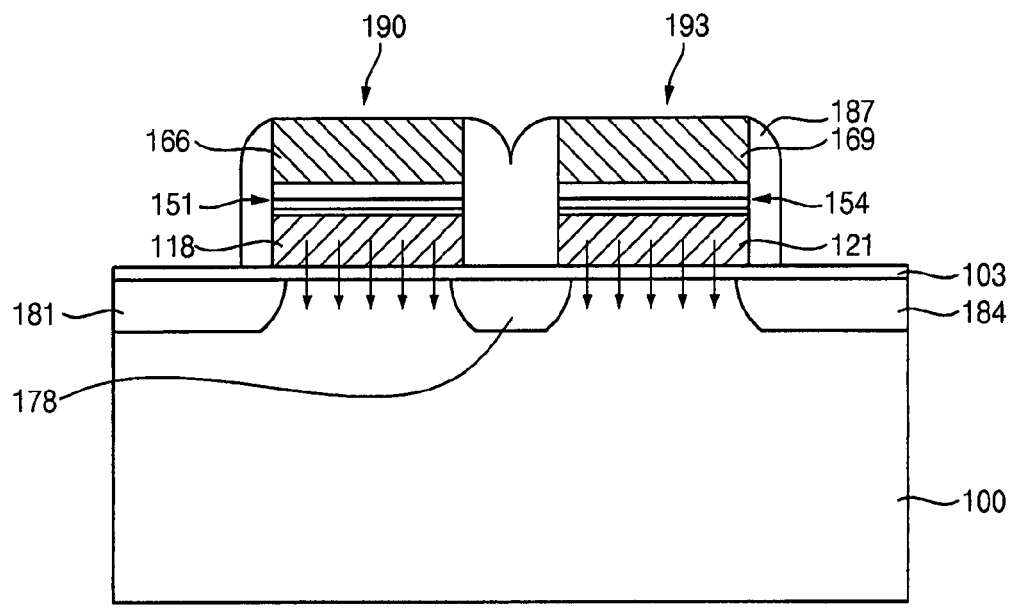

FIGS. 9 and 10 are cross-sectional views illustrating the programming and erasing operations of the EEPROM device in FIG. 8.

Referring to FIG. 9, when the first transistor 190 serves as a selection transistor of an EEPROM device, the second transistor 193 may serve as a memory transistor of the EEPROM device. Particularly, a VPP1 negative voltage of about −10V, a VPP2 negative voltage of about −10V, a VPP1 positive voltage of about 10V and the VPP1 negative voltage of about −10V are applied to the substrate 100, the first transistor 190, the second transistor 193, and the second drain region 184, respectively, maintaining a floating state of the common source region 178 so that an electric charge provided from the bit line may be stored in the second floating gate 121. (Here, VPP1 and VPP2 are not shown) As a result, data may be inputted into the EEPROM. In this case, a threshold voltage of the second transistor 193 may increase over about 3V.

Figure 11:
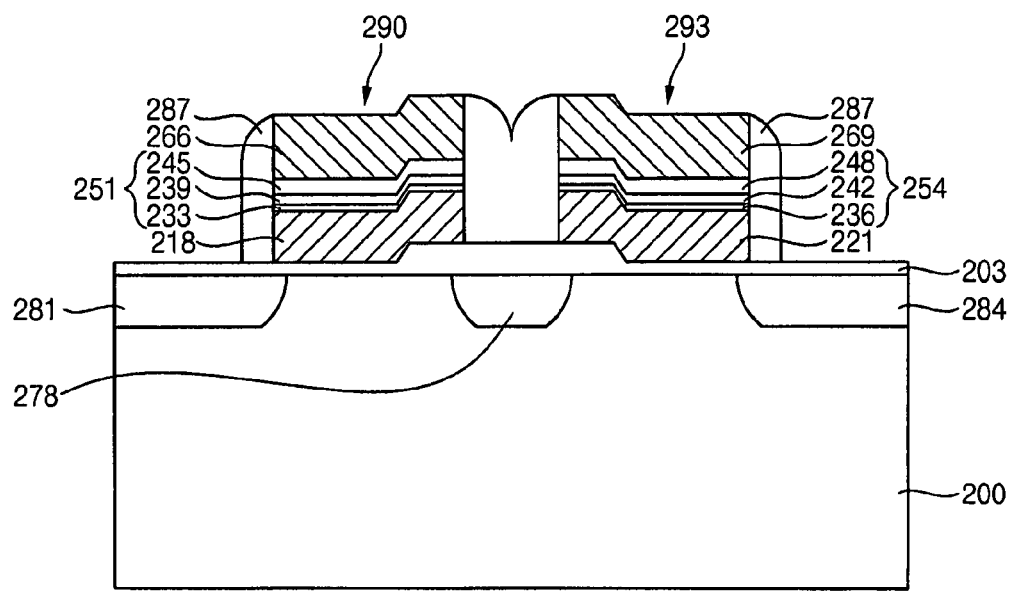
FIG. 11 is a cross-sectional view illustrating another example embodiment of an EEPROM in accordance with an aspect of the present invention.

As illustrated in FIG. 11, when the first transistor 190 serves as the memory transistor of the EEPROM device, the second transistor 193 may serve as the selection transistor of the EEPROM device. Particularly, the VPP1 positive voltage of about 10V, the VPP1 negative voltage of about −10V, and the VPP1 negative voltage of about −10V are applied to the substrate 100, the first transistor 190 and the second transistor 193, respectively, maintaining the floating states of the first drain region 181, the second drain region 184, and the common source region 178 so that the electric charges stored in the first and second floating gates 118 and 121 may be removed. As a result, the data may be erased from the EEPROM device.

As illustrated in FIGS. 9 and 10, the first and second transistors 190 and 193 included in the EEPROM device in FIG. 8 may alternately serve as the memory transistor and the selection transistor according to an applied voltage. For example, in case that the first transistor 190 serves as the memory transistor of the EEPROM device, the second transistor 193 may serve as the selection transistor of the EEPROM device. Alternatively, in case that the first transistor 190 serves as the selection transistor of the EEPROM device, the second transistor 193 may serve as the memory transistor of the EEPROM device. As illustrated in FIGS. 9 and 10, functional changes of the first and second transistors 190 and 193 may be controlled using an applied signal. Thus, the EEPROM device having a relatively simple structure may be manufactured by performing the reduced number of processes. As a result, a time and a cost required for manufacturing the EEPROM device may be decreased. In addition, an area where a unit memory cell of the EEPROM device is formed may decrease because the unit memory cell of the EEPROM includes the pair of transistors having substantially the same structure.

FIG. 11 is a cross-sectional view illustrating another example embodiment of an EEPROM in accordance with an aspect of the present invention.

Referring to FIG. 11, the EEPROM device may include a first transistor 290 and a second transistor 293. The first and second transistors 290 and 293 may be formed on a tunnel insulating layer 203 having a protruded center portion such that the first and second transistors 290 and 293 are spaced apart from each other. The first and second transistors 290 and 293 may have substantially the same structure.

The center portion of the tunnel insulating layer 203 formed on a substrate 200 such as a silicon wafer and an SOI substrate may be protruded, as noted above. For example, the tunnel insulating layer 203 may include the center portion, a first portion and a second portion. A height of the center portion may be larger than those of the first and second portions. The first and second portions may be formed at both sides of the center portion. In this embodiment, to form the tunnel insulating layer 203, a preliminary tunnel insulating layer is initially formed on the substrate 200 by a thermal oxidation process or a chemical mechanical deposition (CVD) process, as examples. Thereafter, the preliminary tunnel insulating layer is partially etched to form the tunnel insulating layer 203. Here, the preliminary tunnel insulating layer may be partially etched by an isotropic etching process, for example. In case that the tunnel insulating layer 203 has the protruded center portion, a voltage may be stably applied to a common source region 278 so that an electric reliability of the EEPROM device may be improved.

The first transistor 290 may be formed on the first portion and the center portion of the tunnel insulating layer 203. The first transistor 290 may include a first floating gate 218, a gate insulating structure 251, and a first control gate 266.

The first floating gate 218 extends from the first portion to the center portion of the tunnel insulating layer 203 so that a first portion of the first floating gate 218 may be upwardly protruded by the protruded center portion of the tunnel insulating layer 203. Particularly, the first portion of the first floating gate 218 formed on the protruded center portion of the tunnel insulating layer 203 may be higher than a second portion of the first floating gate 218 formed on the first portion of the tunnel insulating layer 203. The first gate insulating structure 251 may include a first lower oxide layer pattern 233, a first nitride layer pattern 239, and a first upper oxide layer pattern 245 which are successively formed on the first floating gate 218. The first gate insulating structure 251 may be conformally formed on the first floating gate 218 because the first gate insulating structure 251 is provided on the first floating gate 218. For example, a first portion of the first gate insulating structure 251 may be upwardly protruded with respect to a second portion of the first gate insulating structure 251 opposite to the first portion of the first gate insulating structure 251. Particularly, first portions of the first lower oxide layer pattern 233, the first nitride layer pattern 239, and the first upper oxide layer pattern 245 located over the protruded center portion of the tunnel insulating layer 203 may be upwardly protruded with respect to second portions of the first lower oxide layer pattern 233, the first nitride layer pattern 239, and the first upper oxide layer pattern 245 opposite to the first portions of the first lower oxide layer pattern 233, the first nitride layer pattern 239, and the first upper oxide layer pattern 245. In addition, a first control gate 266 formed on the first gate insulating structure 251 may be substantially structurally the same as the first floating gate 218.

The second transistor 293 may structurally correspond to the first transistor 290. The second transistor 293 may include a second floating gate 221, a second insulating structure 254, and a second control gate 269 that are successively formed on the second portion and the center portion of the tunnel insulating layer 203. The second floating gate 221, the second insulating structure 254, and the second control gate 269 may structurally correspond to the first floating gate 218, the gate insulating structure 251 and the first control gate 285, respectively. For example, first portions of the second floating gate 221, the second insulating structure 254 and the second control gate 269 may be upwardly protruded with respect to second portions of the second floating gate 221, the second insulating structure 254, and the second control gate 269 opposite to the first portions of the second floating gate 221, the second insulating structure 254, and the second control gate 269. The second gate insulating structure 254 may include a second lower oxide layer pattern 236, a second nitride layer pattern 242, and a second upper oxide layer pattern 248 that are successively formed on the second floating gate 221.

The common source region 278 is formed at a portion of the substrate 200 located under the center portion of the tunnel insulating layer 203. A first drain region 281 is formed at a first portion of the substrate 200 adjacent to the first transistor 290. In addition, a second drain region 284 is formed at a second portion of the substrate 200 adjacent to the second transistor 293. Gate spacers 287 may be formed on sidewalls of the first and second transistors 290 and 293. Alternatively, the gate spacers 287 need not be formed.

The programming and erasing operations of the EEPROM device in FIG. 11 may be substantially the same as those of the EEPROM device in FIGS. 9 and 10 including the first and second transistors 290 and 293 having shapes substantially different from those of the first and second transistors 190 and 193, as discussed above. Thus, any further explanation with respect thereto will be omitted.

FIGS. 12 to 23 are cross-sectional views illustrating an embodiment of a method of manufacturing an EEPROM device in accordance with aspects of the present invention, such as the EEPROM of FIGS. 8 and 11. In FIGS. 12 to 23, the same reference numerals will be used to refer to the same or like parts as those described in FIG. 8 or 11.

Figure 12:
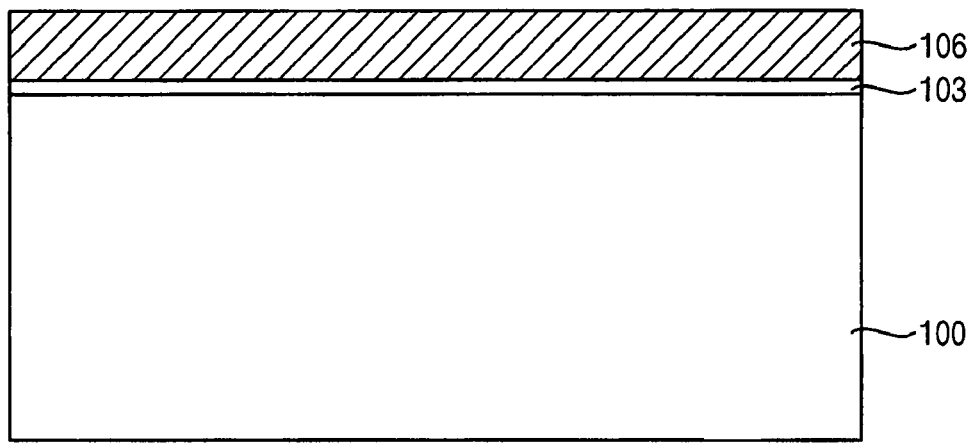
FIGS. 12 to 23 are cross-sectional views illustrating an embodiment of a method of manufacturing an EEPROM device in accordance with an aspect of the present invention.

FIG. 12 is a cross-sectional view illustrating steps of forming the tunnel insulating layer 103 and the first conductive layer 106.

Referring to FIG. 12, an active region of the substrate 100 is defined by forming an isolation layer (not shown). The tunnel insulating layer 103 is then formed on the active region of the substrate 100. The substrate 100 may be a silicon wafer or an SOI substrate, as examples. The isolation layer may be formed by an isolation process, e.g., such as a shallow trench isolation (STI) process. For example, the isolation layer may be formed using an oxide including silicon oxide. In an example embodiment, the substrate 100 may be a P-typed substrate doped with P-typed impurities.

The tunnel insulating layer 103 may be formed by a thermal oxidation process or a CVD process, as examples. In an example embodiment, the tunnel insulating layer 103 may be formed to a relatively thin thickness of about 50 Å to about 100 Å measured from an upper surface of the substrate 100.

In another example embodiment, the preliminary tunnel insulating layer is formed on the substrate 200. Thereafter, the preliminary tunnel insulating layer is partially etched to form the tunnel oxide layer 203. Accordingly, as shown in FIG. 11, the center portion of the tunnel insulating layer 203 may be upwardly protruded with respect to the first and second portions. Here, the preliminary tunnel insulating layer may be partially etched by the isotropic etching process. In this case, the common source region 278 may be subsequently formed at the portion of the substrate 200 located under the center portion.

The first conductive layer 106 is formed on the tunnel insulating layer 103. The first conductive layer 106 may include polysilicon doped with impurities. The first conductive layer 106 may be formed by a CVD process, a plasma-enhanced chemical mechanical deposition (PECVD) process, or a low-pressure chemical mechanical deposition (LPCVD) process. For example, the first conductive layer 106 may be formed to a thickness of about 1000 Å to about 2000 Å measured from an upper surface of the tunnel insulating layer. In another example embodiment, metal or metal nitride may be deposited by a CVD process, an atom implantation process, or a sputtering process to form the first conductive layer 106.

Figure 13:
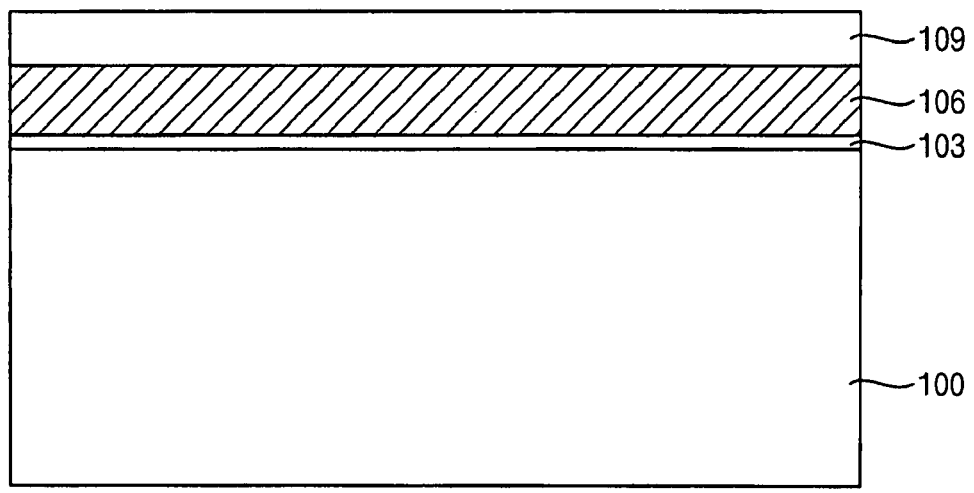

FIG. 13 is a cross-sectional view illustrating steps of forming a first mask layer 109 on the first conductive layer 106.

Referring to FIG. 13, the first mask layer 109 is formed on the first conductive layer 106. The first mask layer 109 may be formed using a material having an etching selectivity with respect to the first conductive layer 106. In an example embodiment, the first mask layer 109 may be formed using an oxynitride, e.g., such as silicon oxynitride. The first mask layer 109 may be formed by a CVD process, a PECVD process, or an LPCVD process. For example, the first mask layer 109 may be formed to a thickness of about 500 Å to about 1500 Å measured from an upper surface of the first conductive layer 106.

Figure 14:
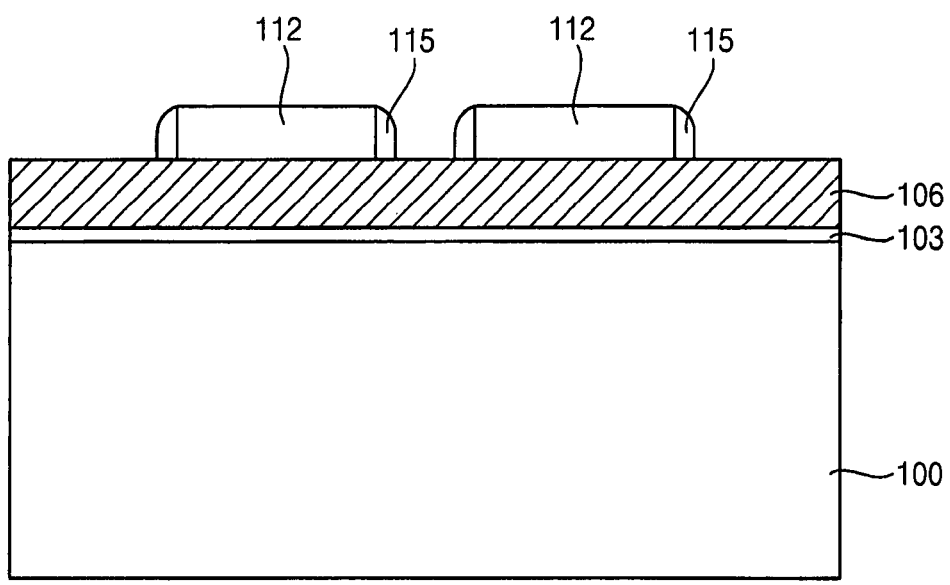

FIG. 14 is a cross-sectional view illustrating steps of forming the first mask pattern 112 and the spacers 115 on the first conductive layer 106.

Referring to FIG. 14, the first mask layer 109 is etched by a photolithography process so that the first mask pattern 112 may be formed on the first conductive layer 106. The first mask pattern 112 may be used as an etch mask required for forming the first and second floating gates 118 and 121 (see FIG. 15) employed in the first and second transistors 190 and 193 (see FIG. 23), respectively. In an example embodiment, the first mask pattern 112 may be formed by a dry etching process.

The first insulating layer (not shown) is formed on the first conductive layer 106 to cover the first mask patterns 112. A material having an etching selectivity with respect to the first mask patterns 112 and the first conductive layer 106 may be deposited by a CVD process, a PECVD process, or an LPCVD process to form the first insulating layer. For example, the first insulating layer may be formed using a nitride, e.g., such as silicon nitride. The first insulating layer may be formed to a thickness of 500 Å to about 1000 Å measured from upper surfaces of the first mask patterns 112 and the first conductive layer 106.

The spacers 115 are formed on the sidewalls of the first mask patterns 112 by partially etching the first insulating layer. The first and second floating gates 118 and 121 of the first and second transistors 190 and 193 may be subsequently formed using the first mask patterns 112 and the spacers 115 as etch masks. For example, the spacers 115 may be formed by an anisotropic etching process.

Figure 15:
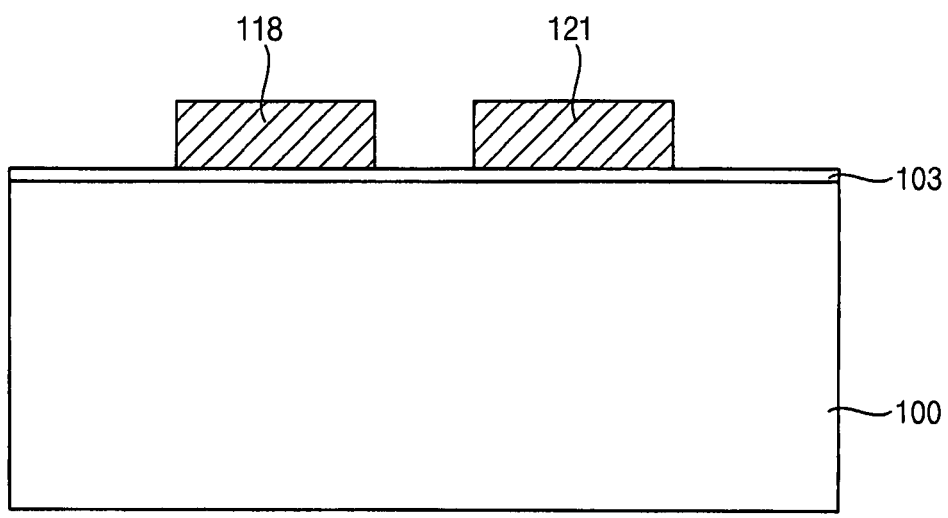

FIG. 15 is a cross-sectional view illustrating steps of forming the first and second floating gates 118 and 121 on the tunnel insulating layer 103.

Referring to FIG. 15, the first conductive layer 106 is etched using the first mask patterns 112 and the spacers 115 as the etch masks so that the first and second floating gates 118 and 121 may be formed on the tunnel insulating layer 103. In an example embodiment, the first and second floating gates 118 and 121 may be formed by a dry etching process. The first and second floating gates 118 and 121 may be formed to have substantially the same thickness of about 1000 Å to 2000 Å. For example, the first and second floating gates 118 and 121 may have heights of about 1500 Å measured from an upper surface of the tunnel insulating layer 103. In addition, the first and second floating gates 118 and 121 may have substantially the same width. The first and second floating gates 118 and 121 may be spaced apart from each other.

The first mask patterns 112 and the spacers 115 are removed from the first and second floating gates 118 and 121. In an example embodiment, the first mask patterns 112 and the spacers 115 may be removed by a wet etching process using an etching solution including phosphoric acid. In another example embodiment, the first mask patterns 112 and the spacers 115 may be removed by a dry etching process using an etching gas including phosphoric acid.

Figure 16:
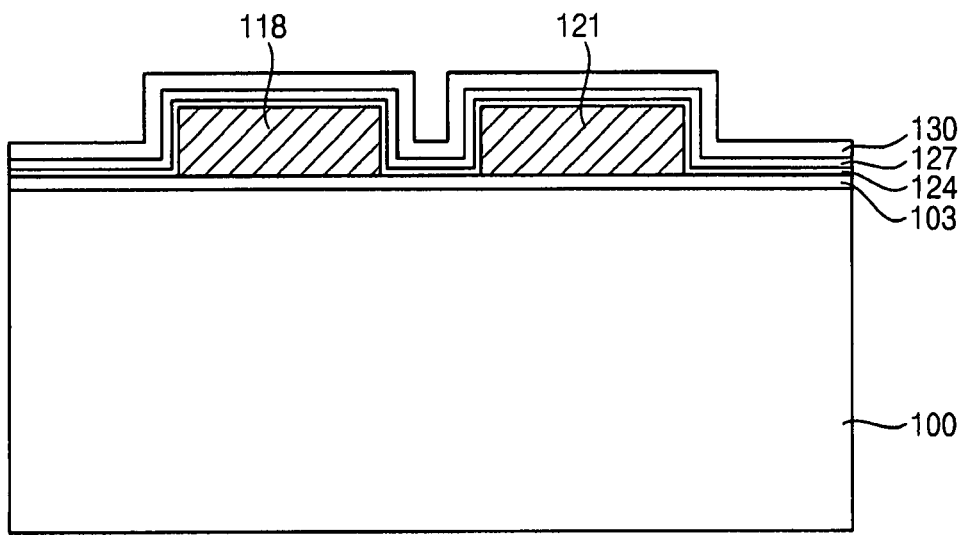

FIG. 16 is a cross-sectional view illustrating steps of forming a lower oxide layer 124, a nitride layer 127, and an upper oxide layer 130 on the tunnel insulating layer 103, the first floating gate 118, and the second floating gate 121, respectively.

Referring to FIG. 16, the lower oxide layer 124, the nitride layer 127, and the upper oxide layer 130 are successively formed on the tunnel insulating layer 103 to cover the first and second floating gates 118 and 121. In an example embodiment, MTO is deposited by a CVD process or a high density chemical vapor deposition (HDP-CVD) process to form the lower oxide layer 124. The lower oxide layer 124 may be formed to a thickness of about 10 Å to about 50 Å measured from upper surfaces of the first and second floating gates 118 and 121. For example, the lower oxide layer 124 may have a thickness of about 30 Å.

Silicon nitride may be deposited by a CVD process or a PECVD process to form the nitride layer 127. The nitride layer 127 may be formed to a thickness of about 50 Å to about 90 Å measured from an upper surface of the lower oxide layer 124. For example, the nitride layer 127 may have a thickness of about 70 Å.

MTO may be deposited by a CVD process or a PECVD process to form the upper oxide layer 130. The upper oxide layer 130 may be formed to a thickness of about 50 Å to about 150 Å measured from the upper surface of the nitride layer 127. For example, the upper oxide layer 130 may have a thickness of about 100 Å. Thus, a thickness ratio among the lower oxide layer 124, the nitride layer 127 and the upper oxide layer 130 may be about 1:5:5 to 5:9:15 (or 1-5:5-9:5-15).

In an example embodiment, a thermal treatment process may be further performed under a nitrogen atmosphere after the lower oxide layer 124 covering the first and second floating gates 118 and 121 is formed. Thus, characteristics of the first floating gate 118, the second floating gate 121, and the lower oxide layer 124 may be improved. For example, the thermal treatment process may be performed at a temperature of about 400° C. to about 600° C. under a nitrogen monoxide atmosphere.

Figure 17:
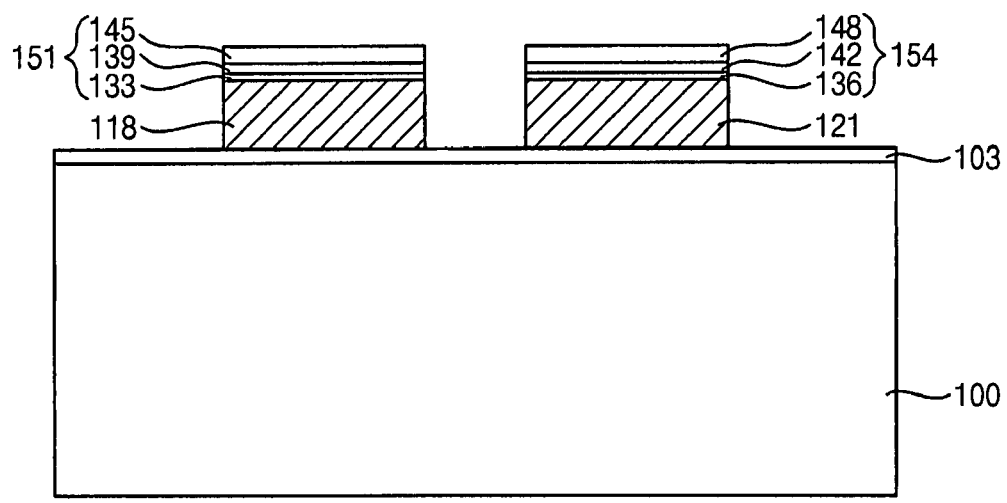
Figure 18:
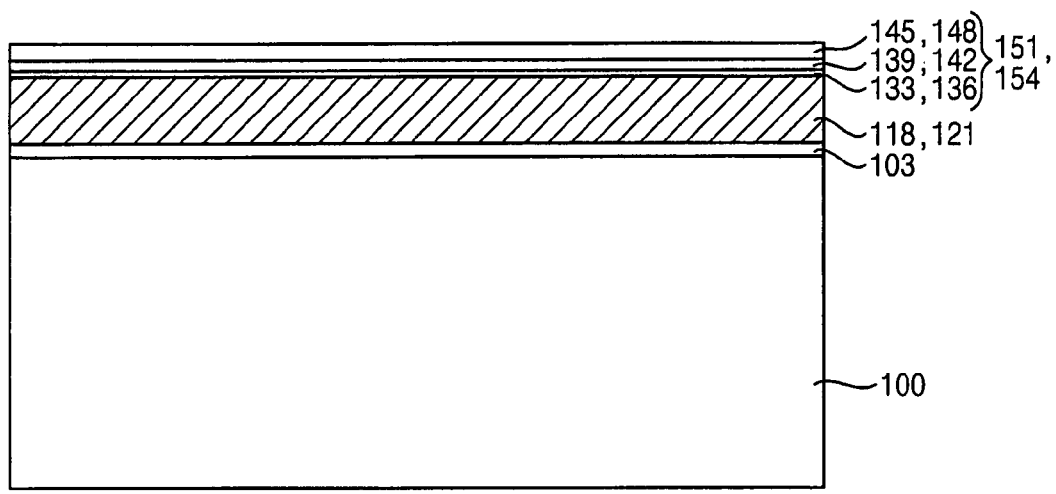

FIGS. 17 and 18 are cross-sectional views illustrating steps of forming the first and second gate insulating structures 151 and 154. Particularly, FIG. 17 is a cross-sectional view taken along a direction parallel with the bit line of the EEPROM device. FIG. 18 is a cross-sectional view taken along a direction parallel with a word line of the EEPROM device.

Referring to FIGS. 17 and 18, additional mask patterns (not shown) are formed on the upper oxide layer 130. Thereafter, the upper oxide layer 130, the nitride layer 127, and the lower oxide layer 124 are successively etched using the additional mask patterns as etch masks so that the first and second gate insulating structures 151 and 154 may be formed. In an example embodiment, the additional mask patterns may be formed using an oxynitride, e.g., such as silicon oxynitride. The first and second gate insulating structures 151 and 154 may be formed by a dry etching process. In another example embodiment, a photoresist pattern (not shown) is formed on the second oxide layer 130. The first and second gate insulating structures 151 and 154 may be then formed by an etching process employing the photoresist pattern as an etch mask.

The first gate insulating structure 151 is formed on the first floating gate 118. The second insulating structure 154 is formed on the second floating gate 121. The first gate insulating structure 151 may include the first lower oxide layer pattern 133, the first nitride layer pattern 139, and the first upper oxide layer pattern 145 that are successively formed on the first floating gate 118. The second gate insulating structure 154 may include the second lower oxide layer pattern 136, the second nitride layer pattern 142, and the second upper oxide layer pattern 148 that are successively formed on the second floating gate 121. In an example embodiment, the first and second gate insulating structures 151 and 154 may have substantially the same thickness and width.

Figure 19:
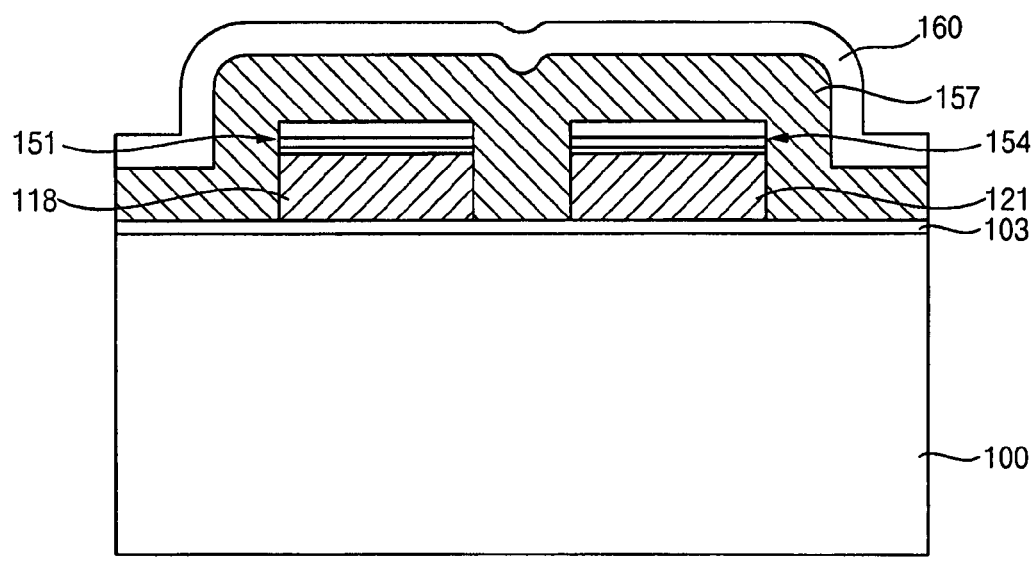
Figure 20:
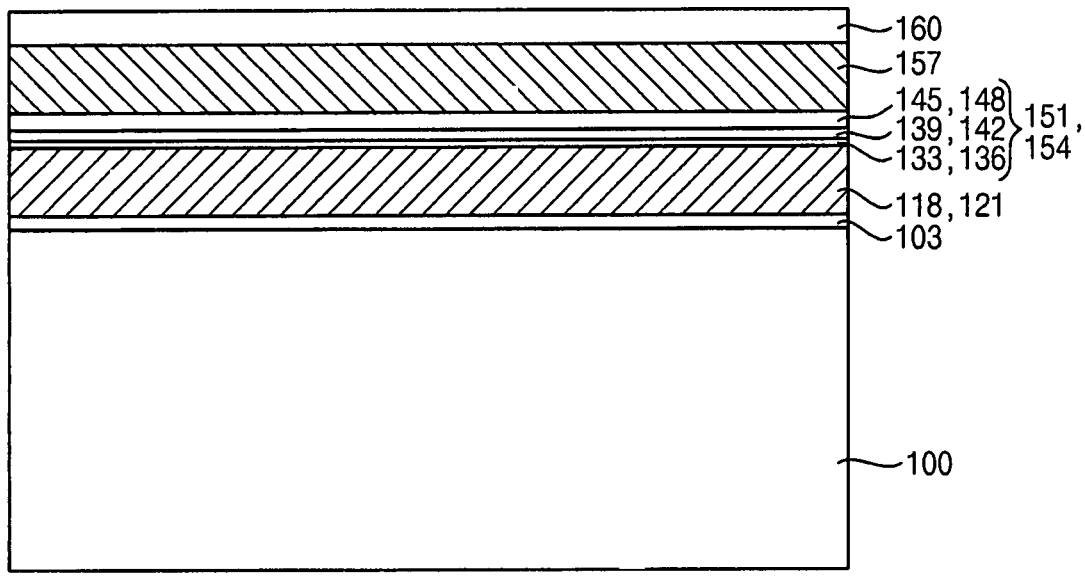

FIGS. 19 and 20 are cross-sectional views illustrating steps of forming a second conductive layer 157 and a second mask layer 160 on the first and second gate insulating structures 151 and 154. Particularly, FIG. 19 is a cross-sectional view taken along a direction parallel with the bit line of the EEPROM device. FIG. 20 is a cross-sectional view taken along a direction parallel with the word line of the EEPROM device.

Referring to FIGS. 19 and 20, the second conductive layer 157 is formed on the tunnel insulating layer 103 to cover the first and second gate insulating structures 151 and 154. The second conductive layer 157 may be formed using metal, metal nitride, or polysilicon doped with impurities, as examples. In addition, the second conductive layer 157 may be formed by a CVD process, an LPDVD process, a PECVD process, an atomic layer deposition process, or a sputtering process. The second conductive layer 157 may be formed to a thickness of about 1000 Å to about 2000 Å measured from upper surfaces of the first and second gate insulating structures 151 and 154. For example, the second conductive layer 157 may have a thickness of about 1500 Å. In addition, the second conductive layer 157 may be formed at a temperature of about 500° C. to 700° C. For example, the second conductive layer 157 may be formed at a temperature of about 620° C.

The second mask layer 160 is formed on the second conductive layer 157. The second mask layer 160 may be formed using a material having an etching selectivity with respect to the second conductive layer 157. For example, the second mask layer 160 may be formed using an oxynitride, e.g., such as silicon oxynitride. In addition, the second mask layer 160 may be formed by a CVD process, a PECVD process, or an LPCVD process, as examples. The second mask layer 160 may be formed to a thickness of about 600 Å to about 1000 Å. For example, the second mask layer 160 may have a thickness of about 800 Å.

Figure 21:
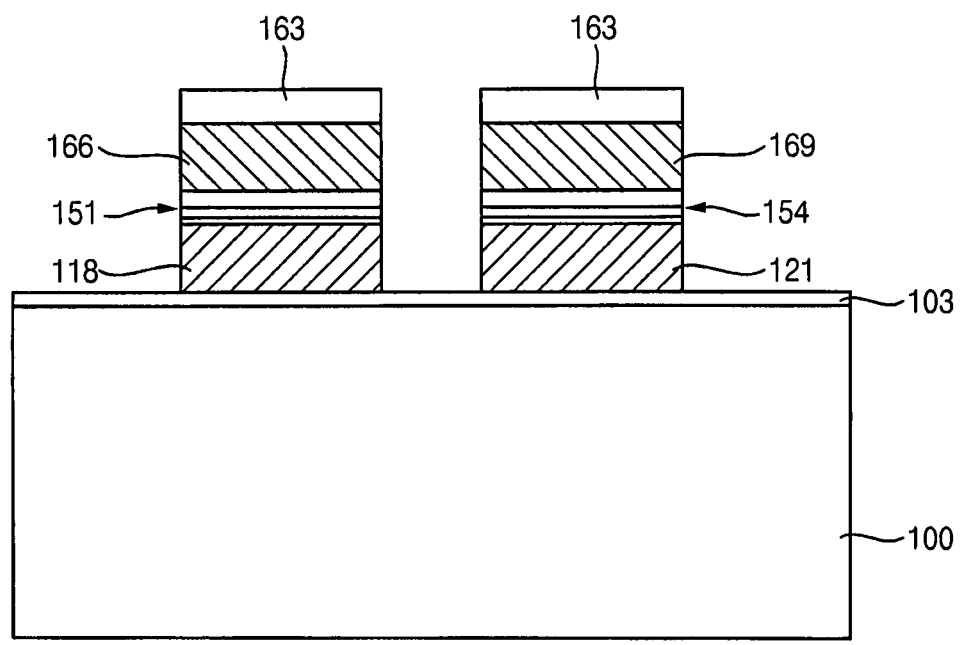

FIG. 21 is a cross-sectional view illustrating steps of forming second mask patterns 163, the first control gate 166, and the second control gate 169 on the first and second gate insulating structures 151 and 154.

Referring to FIG. 21, the second mask patterns 163 is formed on the second conductive layer 157 by patterning the second mask layer 160. In an example embodiment, the second mask patterns 163 may have substantially the same shape as the first mask patterns 112.

The second conductive layer 157 is etched using the second mask patterns 163 as etch masks so that the first and second control gates 166 and 169 may be formed on the first and second gate insulating structures 151 and 154, respectively. In an example embodiment, the first and second control gates 166 and 169 may be formed by a dry etching process, for example. Accordingly, the first and second gate structures may be formed on the tunnel insulating layer 103. The first gate structure may include the first floating gate 118, the first gate insulating structure 151, and the first control gate 166. The second gate structure may include the second floating gate 121, the second gate insulating structure 154, and the second control gate 169.

Figure 22:
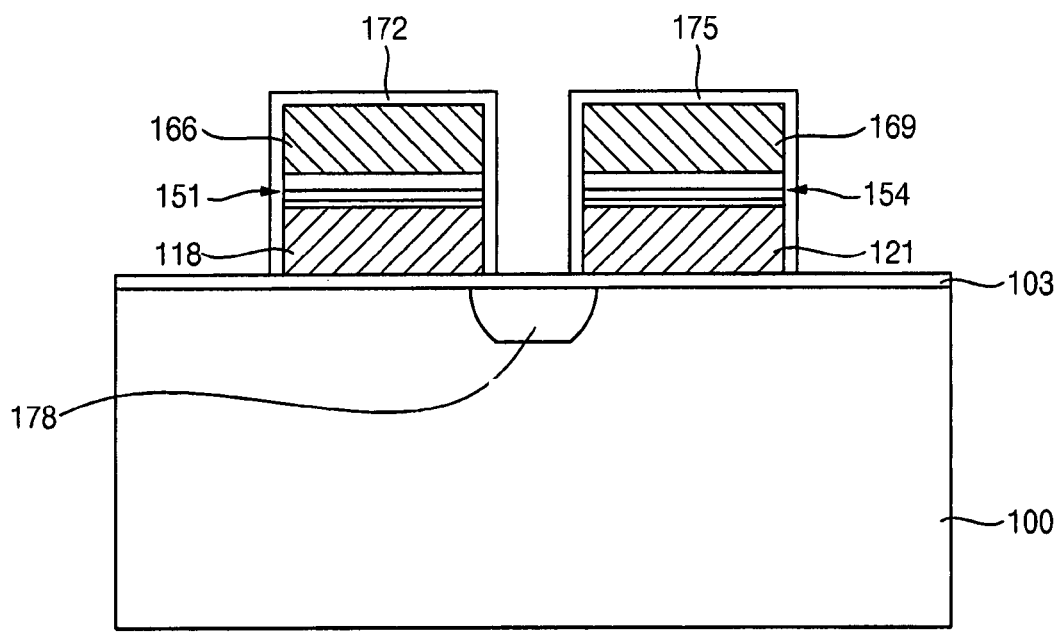

FIG. 22 is a cross-sectional view illustrating steps of forming a first protecting layer 172, a second protecting layer 175, and the common source region 178.

Referring to FIG. 22, an oxidation process is performed on the first and second gate structures after the second mask patterns 163 is removed from the first and second control gates 166 and 169. Accordingly, the first and second protecting layers 172 and 175 may be formed on sidewalls and upper surfaces of the first and second gate structures. The first and second protecting layers 172 and 175 may protect the first and second gate structures while subsequent processes, such as an ion implantation process, are performed. Particularly, the first protecting layer 172 is formed on sidewalls of the first floating gate 118, sidewalls of the first gate insulating structure 151, sidewalls of the first control gate 166, and an upper surface of the first control gate 166. The second protecting layer 175 may be formed on sidewalls of the second floating gate 121, sidewalls of the second gate insulating structure 154, sidewalls of the second control gate 169, and an upper surface of the second control gate 169. The first and second protecting layers 172 and 175 may be formed to thicknesses of about 50 Å to about 70 Å measured from upper surfaces of the first and second control gates 166 and 169. For example, the first and second protecting layers 172 and 175 may have thicknesses of about 70 Å.

In an example embodiment, the oxidation process may be performed at a temperature of about 800° C. to about 900° C. For example, the first and second protecting layers 172 and 175 may be formed at a temperature of about 850° C.

In another example embodiment, an ion implantation process required to form the common source region 178 may be performed without forming the first and second protecting layers 172 and 175 on the sidewalls of the first and second gate structures.

Referring again to FIG. 22, first impurities are implanted into a portion of the substrate 100 located between the first and second gate structures by the implantation process employing the first and second gate structures as the ion implantation masks. Thus, the common source region 178 may be formed at the portion of the substrate 100 located between the first and second gate structures. The common source region 178 may include N-typed impurities, e.g., such as phosphorus (P). The common source region 178 may be formed by implanting the first impurities at an energy of about 30 to about 40 keV. For example, the common source region 178 may be formed by implanting the N-typed impurities into the substrate 100 at an energy of about 35 keV. The common source region 178 may have a relatively small first impurity concentration of about $1 \times 10^{14}$ to about $9 \times 10^{14}$ atoms/cm$^2$. For example, the first impurity concentration may be about $2 \times 10^{14}$ atoms/cm$^2$.

Figure 23:
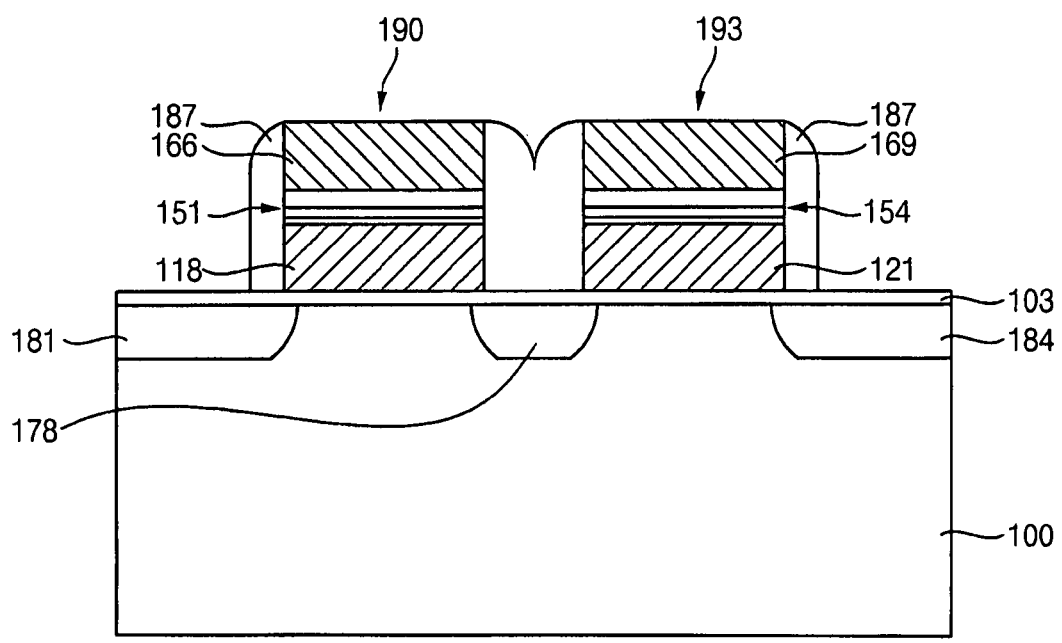

FIG. 23 is a cross-sectional view illustrating steps of forming the first drain region 181, the second drain region 184, and the gate spacers 187.

Referring to FIG. 23, second impurities are implanted into first and second portions of the substrate 100 adjacent to the first and second gate structures, respectively, so that the first and second drain regions 181 and 184 may be formed at the first and second portions, respectively, of the substrate 100. The first and second drain regions 181 and 184 may be formed by implanting N-typed impurities such as arsenic (As) at an energy of about 50 to about 60 keV. For example, the first and second drain regions 181 and 184 may be formed by implanting the second impurities into the first and second portions of the substrate 100, respectively, at an energy of about 55 keV. The first and second drain regions 181 and 184 may have relatively large second and third impurity concentrations, respectively, of about $1 \times 10^{15}$ to about $9 \times 10^{15}$ atoms/cm$^2$. The second impurity concentration of the first drain region 181 may be substantially the same as the third impurity concentration of the second drain region 184. For example, the first and second drain regions 181 and 184 may have relatively high second and third impurity concentrations of about $6 \times 10^{15}$ atoms/cm$^2$, respectively. Accordingly, the first and second transistors 190 and 193 having substantially the same structure may be formed on the substrate 100. The first transistor 190 may include the first drain region 181, the common source region 178 and the first gate structure 190. The second transistor 193 may include the second drain region 184, the common source region 178, and the second gate structure 193. In an example embodiment, the first and second drain regions 181 and 184 may correspond to the first and second bit line junction regions, respectively.

The first and second protecting layers 172 and 175 may be removed from the first and second gate structures 190, 193 after the first and second drain regions 181 and 184 are formed. In an example embodiment, the first and second protecting layers 172 and 175 may be subsequently removed by first and second etching processes. An etching solution including sulfuric acid ($H_2SO_4$) cam be used in the first etching process. An etching solution including fluorine (F) may be used in the second etching process. For example, the first etching process may be performed for about 5 to about 15 minutes. The second etching process may be performed for about 1 to about 19 minutes. When the first and second protecting layers 172 and 175 are removed, the sidewalls of the first and second gate structures may be exposed.

Referring again to FIG. 23, a second insulating layer is formed on the tunnel insulating layer 103 to cover the exposed first and second gate structures 190, 193. For example, the second insulating layer may be formed using a nitride, e.g., such as silicon nitride.

The second insulating layer is partially etched so that the gate spacers 187 may be formed on the sidewalls of the first and second gate structures 190, 193. For example, the gate spacers 187 may be formed by an anisotropic etching process. In another example embodiment, the gate spacers 187 need not be formed on the sidewalls of the first and second gate structures 190, 193. In still another example embodiment, the first and second drain regions 181 and 184 may be formed at the first and second portions of the substrate 100 after the gate spacers 187 are formed on the sidewalls of the first and second gate structures 190, 193.

According to the present invention, the EEPROM device includes the first and second transistors having substantially the same structure. The first transistor and the second transistor alternately serve as the memory transistor and the selection transistor of the EEPROM device in response to the applied signal. Accordingly, the EEPROM device having a relatively simple structure may be manufactured by performing the reduced number of processes. As a result, a time and a cost required for manufacturing the EEPROM device may be decreased. In addition, an area where a unit memory cell of the EEPROM device is formed may be decreased because the unit memory cell of the EEPROM includes the pair of transistors having substantially the same structure.

The foregoing is illustrative of aspects of the present invention and is not to be construed as limiting thereof. Although a few embodiments have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An electrically erasable and programmable read only memory (EEPROM) device comprising:
   a substrate; and
   a pair of transistors including first and second transistors formed on the substrate,
   the first and second transistors having substantially the same structure and configured to alternately serve as a memory transistor and a selection transistor within the same memory cell according to an applied signal,
   wherein a common source region is formed between the first and second transistors, as a source region for both of the first and second transistors,
   a first drain region is formed adjacent to the first transistor opposite the common source region, and
   a second drain region is formed adjacent to the second transistor opposite the common source region,
   wherein the common source region, the first drain region, and the second drain region have a first impurity concentration, a second impurity concentration, and a third impurity concentration, respectively,
   the second and third impurity concentrations being substantially larger than the first impurity concentration, and
   wherein the first transistor includes a first floating gate that is not shorted with a second floating gate of the second transistor.

2. The EEPROM device of claim 1, wherein:
   the first transistor comprises:
      a tunnel insulating layer formed on the substrate;
      a first gate structure formed on the tunnel insulating layer;
      the first drain region formed at a first portion of the substrate adjacent to the first gate structure; and
      the common source region, and the second transistor comprises:
      the tunnel insulating layer formed on the substrate;
      a second gate structure formed on the tunnel insulating layer;
      the second drain region formed at a second portion of the substrate adjacent to the second gate structure; and
      the common source region.

3. The EEPROM device of claim 2, further comprising a bit line electrically connected to the first drain region and the second drain region.

4. The EEPROM device of claim 2, wherein the substrate has a first conductive type, and the common source region, the first drain region, and the second drain region have a second conductive type.

5. The EEPROM device of claim 4, wherein the first conductive type is a P-type and the second conductive is an N-type.

6. The EEPROM device of claim 2, wherein:
   the first gate structure comprises:
      a first floating gate formed on the tunnel insulating layer;
      a first gate insulating structure formed on the first floating gate; and
      a first control gate formed on the first gate insulating structure, and the second gate structure comprises:
      a second floating gate formed on the tunnel insulating layer;
      a second gate insulating structure formed on the second floating gate; and
      a second control gate formed on the second gate insulating structure.

7. The EEPROM device of claim 6, wherein the first gate insulating structure comprises a first lower oxide layer pattern, a first nitride layer pattern, and a first upper oxide layer pattern, and the second gate insulating structure comprises a second lower oxide layer pattern, a second nitride layer pattern, and a second upper oxide layer pattern.

8. The EEPROM device of claim 7, wherein the first lower oxide layer pattern, the second lower oxide layer pattern, the first upper oxide layer pattern, and the second upper oxide layer pattern comprise a middle temperature oxide and the first nitride layer pattern and the second nitride layer pattern comprises a silicon oxide.

9. The EEPROM device of claim 2, wherein the tunnel insulating layer includes a center portion, a first portion, and a second portion, the center portion being located on the common source region and upwardly protruded with respect to the substrate, the first and second portions being formed at both sides of the center portion.

10. The EEPROM device of claim 9, wherein a first portion of the first gate structure is located on the first portion of the tunnel insulating layer, a second portion of the first gate structure opposite to the first portion of the first gate structure is located on the center portion of the tunnel insulating layer, a first portion of the second gate structure is located on the second portion of the tunnel insulating layer, and a second portion of the second gate structure opposite to the first portion of the second gate structure is located on the center portion of the tunnel insulating layer.

11. The EEPROM device of claim 1, further comprising gate spacers formed on sidewalls of the first transistor and the second transistor.

12. A method of manufacturing an EEPROM device, the method comprising:
    forming a tunnel insulating layer on a substrate;
    forming first and second gate structures on the tunnel insulating layer, the first and second gate structures being spaced apart from each other and having substantial the same structure;
    forming a common source region at a portion of the substrate located between the first and second gate structures;
    forming a first drain region at a first portion of the substrate adjacent to the first gate structure; and
    forming a second drain region at a second portion of the substrate adjacent to the second gate structure,
    wherein the common source region, the first drain region, and the second drain region have a first impurity concentration, a second impurity concentration, and a third impurity concentration, respectively,
    the second and third impurity concentrations being substantially larger than the first impurity concentration.

13. The method of claim 12, wherein forming the tunnel insulating layer comprises:
    forming a preliminary tunnel insulating layer on the substrate; and
    forming the tunnel insulating layer on the common source region by partially etching the preliminary tunnel insulating layer, the tunnel insulating layer having a center portion upwardly protruded with respect to the substrate.

14. The method of claim 12, wherein forming the first and second gate structures comprises:
    forming a first floating gate and a second floating gate spaced apart from each other on the tunnel insulating layer;
    forming a first gate insulating structure and a second gate insulating structure on the first floating gate and the second floating gate, respectively; and
    forming a first control gate and a second control gate on the first gate insulating structure and the second gate insulating structure, respectively.

15. The method of claim 14, wherein forming the first and second floating gates comprises:
    forming a first conductive layer on the tunnel insulating layer;
    forming first mask patterns on the first conductive layer; and
    etching the first conductive layer by using the first mask patterns as etch masks.

16. The method of claim 15, wherein forming the first and second floating gates comprises forming spacers on sidewalls of the first mask patterns.

17. The method of claim 14, wherein forming the first and second gate insulating structures comprises:
    forming a lower oxide layer on the first floating gate, the second floating gate and the substrate;
    forming a nitride layer on the lower oxide layer;
    forming an upper oxide layer on the nitride layer; and
    patterning the upper oxide layer, the nitride layer, and the lower oxide layer to form the first and second gate insulating structures on the first floating gate and the second floating gate, respectively, the first gate insulating structure including a first lower oxide layer pattern, a first nitride layer pattern, and a first upper oxide layer pattern, the second gate insulating structure including a second lower oxide layer pattern, a second nitride layer pattern, and a second upper oxide layer pattern.

18. The method of claim 14, wherein forming the first and second control gates comprises:
    forming a second conductive layer on the tunnel insulating layer, the first gate insulating structure, and the second gate insulating structure;
    forming second mask patterns on the second conductive layer; and
    etching the second conductive layer by using the second mask patterns as etch masks.

19. The method of claim 14, further comprising forming a gate spacers on the sidewalls of the first and second gate structures.

20. The method of claim of 19, wherein forming the first and second drain regions is performed after the gate spacers are formed.

21. The method of claim 12, further comprising forming a first protecting layer and a second protecting layer on the sidewalls and an upper surface of each of the first and second gate structures before forming the common source region.

22. The method of claim 21, including forming the first and second protecting layers by an oxidation process.

23. The method of claim 21, further comprising removing the first and second protecting layers after the common source region is formed.

* * * * *